(12) United States Patent
Yu et al.

(10) Patent No.: US 6,414,431 B1
(45) Date of Patent: Jul. 2, 2002

(54) THIN FILM ELECTRODE FOR PLANAR ORGANIC LIGHT-EMITTING DEVICES AND METHOD FOR ITS PRODUCTION

(75) Inventors: Nu Yu, Knoxville, TN (US); Hubert Spreitzer, Frankfurt (DE); Hermann Schenk, Wiesbaden (DE); Willi Kreuder, Mainz (DE); Heinrich Becker, Glashütten (DE)

(73) Assignee: Ayentis Research & Technologies GmbH & Co KG, Frankfurt (DE)

(*) Notice: Subject to any disclaimer, the term of this patent is extended or adjusted under 35 U.S.C. 154(b) by 0 days.

(21) Appl. No.: 09/446,744

(22) PCT Filed: Jun. 22, 1998

(86) PCT No.: PCT/EP98/03806

§ 371 (c)(1),
(2), (4) Date: Mar. 13, 2000

(87) PCT Pub. No.: WO99/02017

PCT Pub. Date: Jan. 14, 1999

(30) Foreign Application Priority Data

Jun. 30, 1997 (EP) .............................. 97110656

(51) Int. Cl.$^7$ ............................... H05B 33/26
(52) U.S. Cl. ..................... 313/504; 428/917
(58) Field of Search .................. 313/504–505; 428/690, 917

(56) References Cited

U.S. PATENT DOCUMENTS

| | | | |
|---|---|---|---|
| 4,792,723 A | 12/1988 | Igarashi et al. ............. | 313/503 |
| 4,885,211 A | 12/1989 | Tang et al. ................. | 428/457 |
| 5,061,569 A | * 10/1991 | Vanslyke et al. ....... | 313/506 X |
| 5,093,691 A | * 3/1992 | Utsugi et al. ........... | 313/506 X |

FOREIGN PATENT DOCUMENTS

| FR | 1419297 | * 10/1965 | ................. 313/506 |

OTHER PUBLICATIONS

Hosokawa Chishio, *Pat. Abs. of Japan 016*: No. 369, Abstract of Japan 04–117485 (Apr. 17, 1992).

Tsunoda Atsushi, *Pat. Abs. of Japan 018*: No. 171, Abstract of Japan 05–343183 (Dec. 24, 1993).

Watanabe Terukazu, *Pat. Abs. of Japan* : No. , Abstract of Japan 06–005369 (Jan. 14, 1994).

Watanabe Hideo, *Pat. Abs. of Japan 018*: No. 317, Abstract of Japan 06–071804 (Mar. 15, 1994).

Takizawa Kazumasa, *Pat. Abs. of Japan 018*: No. 482, Abstract of Japan 06–157036 (Jun. 3, 1994).

Sugita Masaya, *Pat. Abs. of Japan* : No. , Abstract of Japan 07–320868 (Dec. 8, 1995).

* cited by examiner

Primary Examiner—Ashok Patel
(74) Attorney, Agent, or Firm—Connolly Dove Lodge & Hutz LLP

(57) ABSTRACT

An electroluminescent device, comprising at least one organic light emitting layer (103) sandwiched between two electrode layers (102, 104), wherein the ratio r of the sheet resistances of the bottom electrode layer (102) and the top electrode layer (104) is $0.3 <= r <= 3$.

1 Claim, 1 Drawing Sheet

Figure 1:
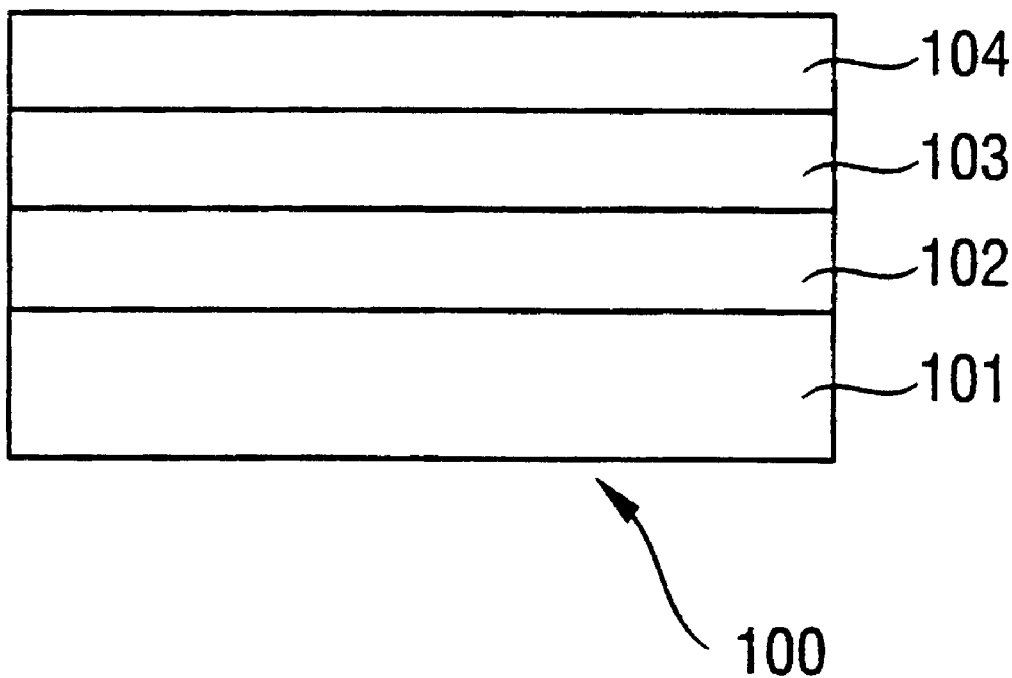

A schematic diagram of an embodiment of the electroluminescent of the invention

A schematic diagram of an embodiment of the electroluminescent of the invention

THIN FILM ELECTRODE FOR PLANAR ORGANIC LIGHT-EMITTING DEVICES AND METHOD FOR ITS PRODUCTION

This invention relates to organic light-emitting devices provided with a light-emitting layer structure, which emits light if an electric current is passed therethrough under an applied electric field and which is formed in a layered structure, and, in particular, it relates to an organic light-emitting diode in which thin film electrodes, cathode and anode, are constructed to be suitable for planar large area organic light-emitting devices.

An electroluminescent device (hereinafter, referred to as to "EL device") is a device from which light is emitted by applying an electric field to a substance, especially a Is semiconductor. Light-emitting diodes are a well-known example of EL devices made from inorganic compound semiconductors of an element (elements) of Groups III to V of the Periodic Table such as GaAs or GaP. These devices emit light effectively at the long wavelength side of the visible light region and are widely utilized for daily electronic appliances, but they have their limit in size and therefore an easy and economical utilization in large-area displays has not yet been realized. As an alternative structure capable of being produced over a large area, thin film type EL devices are well-known which are produced from an inorganic material by doping semiconductors of compounds derived from an element or elements of the Groups II to IV of the Periodic Table such as ZnS, CaS and SrS with Mn or a rare earth metal, for example, Eu, Ce, Tb or Sm as a light-emitting center. However, for driving EL devices using these inorganic semiconductors, alternating current electricity and high voltages are required and thus such EL devices are expensive, and further a full-color device is difficult to obtain.

In order to solve the above problems, EL devices using an organic thin film have been extensively studied. For example, such EL devices include those using a vapor deposition film of an organic luminescent (fluorescent) dye reported in:

S. Hayashi et al., J. Appl. Phys. 25, L773 (1986)

C. W. Tang et al., Appl. Phys. Lett., 51, 913 (1987)

To date, organic EL devices which emit light of from blue to red colors have been developed. Details of organic electroluminescence are described in, for example "Organic EL Device Development Strategy", compiled by Next Generation Display Device Research Association, Science Forum (published 1992) "Electroluminescent Materials, Devices, and Large-Screen Displays", SPIE Proceedings Vol. 1910 (1993), E. M. Conwell and M. R. Miller Further, in recent years, techniques for thin film production by e.g., spin coating or coating have been improved, and EL devices using thermally stable poly(arylene vinylene) polymers have been studied. Such EL devices using poly (arylene vinylene) polymers are described in, for example, the following references:

WO-A 90/13148

Burroughes, Nature, 347, 539 (1990)

D. Braun, Appl. Phys. Lett., 58, 1982 (1991)

However, all high performance devices reported so far have small sizes (e.g. 2 mm×2 mm) of the active device area. One of the major shortcomings presented by the conventional organic light-emitting devices is the difficulty in achieving high efficient operation for large planar displays. A dramatic decrease of the device performance with increase in the size of light-emitting area gives a short device lifetime or even a short circuit without light-emitting.

Up to date, an electroluminescent device consists of electroluminescent layers sandwiched between a metal cathode and transparent conductive anode on substrate.

In such a cathode, the sheet resistance, for example, of Mg:Ag is about 0.5 $\Omega$/square, which is more than one order of magnitude smaller than that of transparent conductive anode of 10 to 100$\Omega$/square.

It has now surprisingly been found that EL devices in which a certain ratio between the sheet resistance of cathode and anode is maintained show improvement in lifetime and EL properties.

Therefore, in one aspect of the present invention an EL-device is provided, comprising at least one organic light emitting layer sandwiched between two electrode layers, characterized in that the ratio r of the sheet resistance of the bottom electrode layer and the top electrode layer is $0.3 \leq r \leq 3$.

EL devices according to the invention are distinguished inter alia by a uniform distribution of applied voltage along the device plane, as uniform distribution of the electrical current in the total area of the device, and improved luminous efficiency and device lifetime.

In a preferred embodiment the ratio between sheet resistance r in the bottom electrode layer and the top electrode layer is $0.5 \leq r \leq 2$ in particular $0.8 \leq r \leq 1.2$.

Referring initially to FIG. 1, an electroluminescent device 100 of the invention comprises, in order, a substrate 101, a bottom electrode layer 102, an organic layer structure 103, and a top electrode layer 104.

Substrate 101 is transparent and e.g. made from glass, quartz glass, ceramic, a polymer, such as polyimide, polyester, polyethylene terephthalate, polycarbonate, polyethylene and polyvinyl chloride. Also the substrate can be non-transparent and e.g. be made from or a single crystal semiconductor selected from the group consisting of either undoped, lightly doped, or heavily doped Si, Ge, GaAs, GaP, GaN, GaSb, InAs, InP, InSb, and $Al_xGa_{1-x}$ As where x is from 0 to 1, or any other III/V-semiconductor.

The electroluminescence device 100 can be viewed as a diode which is forward biased when the anode is at a higher potential than the cathode. Under these conditions, bottom electrode layer 102 acts as an anode for hole (positive charge carrier) injection when this bottom electrode is preferably made from a high work function material, e.g., nickel, gold, platinum, palladium, selenium, iridium or an alloy of any combination thereof, tin oxide, indium tin oxide (ITO) or copper iodide, also, an electroconductive polymer such as poly(3-methylthiophene), polyphenylene sulfide or polyaniline (PANI) or poly-3,4-ethylene dioxythiophene (PEDOT). These materials can be used independently or by layering two or more materials such as by film coating PANI or PEDOT on ITO. The sheet resistance of said electrode layer is preferably less than 100 $\Omega$/square, more preferably less than 30 $\Omega$/square.

On the other hand, top electrode layer 104 can act as an cathode for electron injection when this top electrode is made from a lower (that is than the bottom electrode layer) work function material, preferably a metal or metal alloy, e.g., lithium, aluminum, beryllium, magnesium, calcium, strontium, barium, lanthanum, hafnium, indium, bismuthium, cer, praseodymium, neodymium, samarium, europium, gadolinium, terbium, dysprosium, holmium, erbium, thulium, ytterbium, and lutetium or an alloy of any combination thereof or an alloy of one of this metals with another metal. The sheet resistance of said electrode layer is preferably less than 100 $\Omega$/square, more preferably less than 30 $\Omega$/square.

According to the invention bottom electrode layer 102 and top electrode layer 104 have comparable sheet resistance. Technical measures to achieve this are per se well know to someone skilled in the art and are further described in the next paragraphs.

For example, the ration of sheet resistance is satisfied by changing the layer thickness, of either electrodes or both, preferably from 0.1 nm to 1000 nm and more preferably from 1 nm to 400 nm. This variation is possible due to the existence of the following equation:

$$R[\Omega/\text{square}] = \rho[\Omega*\text{cm}]/d[\text{cm}]$$

with R is the sheet resistance, $\rho$ the specific resistance of the material and d the layer thickness. For example a samarium cathode ($\rho$(samarium)=$9*10^{-7}$ $\Omega*$m) exhibits in dependence of the layer thickness the following sheet resistance:

| Layer Thickness [nm] | Sheet Resistance [$\Omega$/square] |
|---|---|
| 10 | 90 |
| 50 | 18 |
| 100 | 9 |
| 200 | 4.5 | the ratio of sheet resistance also is satisfied by changing background pressure of evaporation for the electrode layers from $10^{-4}$ to $10^{-10}$ mbar. With this method a variale amount of moisture and oxygen or nitrogen or both is present during the evaporation and induces (depending on the metal used) the formation of a variable amount of metal oxide or nitride which exhibits (for constant layer thickness) a higher sheet resistance. By this method the sheet resistance of a selected metal can be adapted over a wide range. For example the sheet resistance of ytterbium is triggered via this method with the following results: (p: background pressure during evaporation [mbar]; layer thickness: 150 nm)

| Background Pressure [mbar] | Sheet Resistance [$\Omega$/square] |
|---|---|
| $1.3 \times 10^{-6}$ mbar | 2 |
| $5.9 \times 10^{-6}$ mbar | 3 |
| $2.8 \times 10^{-5}$ mbar | 5 |
| $6.5 \times 10^{-5}$ mbar | 15 |
| $8.4 \times 10^{-5}$ mbar | 120 |

The ratio of sheet resistance is also satisfied by using an electrode material, which leads by itself (in connection with the specific resistance) to the needed sheet resistance. The following list contains some useful metals for low work function electrodes:

| metal | work function [eV vs. vac] | R [$\Omega$/square] for 100 nm layer |
|---|---|---|
| Li | 2.9 | 0.9 |
| Be | 5.1 | 0.5 |
| Mg | 3.7 | 0.5 |
| Ca | 2.9 | 0.3 |
| Sr | 2.6 | 2.3 |
| Ba | 2.7 | 5.0 |
| La | 3.5 | ~7.0 |
| Ce | 2.9 | 7.5 |
| Pr | 2.7 | 6.8 |
| Nd | 3.2 | 6.4 |
| Sm | 2.7 | 9.2 |
| Eu | 2.5 | 8.1 |
| Gd | 3.1 | 13.4 |
| Th | 3.0 | 11.6 |
| Dy | 3.1 | 9.1 |
| Ho | 3.1 | 9.4 |
| Er | 3.2 | 8.6 |
| Tm | 3.2 | 9.0 |
| Yb | 2.7 | 2.8 |
| Lu | 3.3 | 6.8 |
| Al | 4.3 | 0.3 |
| Ga | 4.2 | 2.7 |
| In | 4.2 | 0.8 |
| Tl | 3.9 | 1.8 |
| Sn | 4.4 | 1.1 |
| Pb | 4.3 | 2.0 |
| Sb | 4.5 | 4.2 |
| Bi | 4.3 | 12.0 |

Additional, the ratio of sheet resistance is satisfied by co-evaporating two or more materials with any combination thereof. By this method it is—for example—possible to produce oxides or nitrides (cf. above) in an easily reproducible way.

In an other aspect of the invention the ratio can also be satisfied by structuring the electrode with the higher surface resistance with a highly conductive material with any geometrical pattern, e. g. lines, a grid, a honeycomb. This material may be applied by any known method for preparing microstructures, such as photolithography, printing, electroless or galvanic plating. For example the sheet resistance of an 10 $\Omega$/square ITO may be lowered to about 1–2 $\Omega$/square by adding small strips of silver (thickness 100 nm; 1 $\mu$m broad; distance: 10 $\mu$m). By this method the transmittance of the ITO is only lowered by 10% but the sheet resistance is decreased by more than a factor of 5.

Also, of the materials used as the anode and cathode, at least one of them is preferably to transmit 50% or more of light in a wavelength region of the emitted light of the device.

The anode, the cathode and the organic layer used in the organic light-emitting diode of the present invention can be formed by a conventional known method, for example, vacuum deposition, spin coating, sputtering or gel-sol method.

Further components of EL devices according to the invention can be selected from those known in the art, e. g. described in U.S. Pat. No. 4.539.507(Kodak), EP-A 0 423 283, and EP-A 0 443 861, or in the literature references given above. The color of the light emitted can be varied by means of the compounds used as light-emitting layer.

Electroluminescence devices are used, for example, as self-illuminating active display elements such as control lamps, alphanumeric displays, high information content matrix displays, information signs, and in opto-electronic couplers.

The invention is illustrated by the examples, without being limited to them.

EXAMPLE 1

Indium tin oxide (ITO) coated polyester (PET) film was used as substrate. This film was manufactured by sputtering a thin layer of ITO with a Sn concentration between 20–30 at-% on flexible clear PET. The ITO-coated PET substrate has a sheet resistance of 50 Ω/square and a visible light transmission of 80%. Prior to coating organic electroluminescent layer, the substrate was well-rinsed. The active layer 103 having a thickness of 100 nm is manufactured by spin coating of a 0.3–0.8 wt. % solution in toluene of conjugated PPV derivative poly[2-methoxy-5-(3,7-dimethyloctyloxy)-p-phenylene vinylene]. Ytterbium electrode 104 was vacuum evaporated with a vapor deposition rate of 1 nm/sec at a pressure of $1 \times 10^{-6}$ mbar. The ytterbium layer was formed with a film thickness of 40 nm monitored by using a corrected quartz oscillator. The sheet resistance value was measured by four-point method. As a result, a sheet resistance value of 31.3 Ω/square was obtained The sheet resistance ratio r of the ytterbium layer to ITO layer is 0.63. The device showed light emission: at a current density of 7 mA/cm$^2$ a luminescence of 100 Cd/m$^2$ was found. The color of the emitted light is orange to red.

COMPARATIVE EXAMPLE 1

Ytterbium electrode 104 was vacuum evaporated in the same manner as in Example 1 except that ytterbium film thickness was 150 nm and the background pressure was $5 \times 10^{-7}$ mbar. The sheet resistance value was measured to be 2.5 Ω/square by four-point method. It gave that the sheet resistance ratio r of the ytterbium layer to ITO layer is 0.05. All devices with the active area larger than 2 mm×2 mm had a short circuit without light-emission.

EXAMPLE 2

ITO coated polyester films were used as substrates. These films were manufactured by sputtering a thin layer of ITO with a Sn concentration between 7–11 at % on flexible clear PET. The ITO-coated PET substrates have a sheet resistance of 25 Ω/square and a visible light transmission of 75%. Prior to coating organic electroluminescent layer, the substrates were well-rinsed. The active layer 103 having a thickness of 100 nm is manufactured by spin coating a 0.3–0.8 wt. % solution in toluene of conjugated PPV derivative poly[2-methoxy-5-(3,7-dimethyloctyloxy)-p-phenylene vinylene]. Ytterbium electrode 104 was vacuum evaporated with a vapor deposition rate of 1 nm/sec at a pressure of $1 \times 10^{-6}$ mbar. The ytterbium layer was formed with a film thickness of 50 nm monitored by using a corrected quartz oscillator. The sheet resistance value was measured by four-point method. As a result, a sheet resistance value of 20 Ω/square was obtained. The sheet resistance ratio r of the ytterbium layer to ITO layer is 0.8. The device showed light emission with quantum efficiencies of 1.8–2.0%.

EXAMPLE 3

An ITO coated glass was used as substrate. The ITO films had a sheet resistance of 10 Ω/square and a visible light transmission of 75%. Prior to coating organic electroluminescent layer, the substrates were well-rinsed. The active layer 103 having a thickness of 100 nm is manufactured by spin coating of a 0.3–0.8 wt. % solution in toluene of conjugated PPV derivative poly[2-methoxy-5-(3,7-dimethyloctyloxy)-p-phenylene vinylene]. Ytterbium electrode 104 was vacuum evaporated with a vapor deposition rate of 1 nm/sec at a pressure of $1 \times 10^{-6}$ mbar. The ytterbium layer was formed with a film thickness of 80 nm monitored by using a corrected quartz oscillator. The sheet resistance value was measured by four-point method. As a result, a sheet resistance value of 9.9 Ω/square was obtained The sheet resistance ratio r of the ytterbium layer to ITO layer is 0.99. The device showed light emission with quantum efficiencies 2–2.5%.

EXAMPLE 4

Two LEDs were prepared according to example 3. LED 1 exhibits an area of 4 mm$^2$, LED B an area of 9 cm$^2$. Both devices show homogeneous light emission with efficiencies in the range given in example 3. No significant difference between the two LEDs concerning efficiency, brightness and homogeneity of light emission was found.

COMPARATIVE EXAMPLE 4

Two LEDs (LED A, 4 mm$^2$; LED B, 9 cm$^2$) were prepared according to example 4 with only one deviation: the Yb cathode was prepared according to Comparative Example 1. The sheet resistance ratio r of the ytterbium layer to ITO layer is 0.25. LED A exhibits the same properties as LED A from example 4. LED B exhibits a nonuniform emission (the brightness variation over the area is more than a factor of 3, which is clearly visible) with a reduced efficiency of 0.8 to 1.2%.

What is claimed is:

1. An electroluminescent device, comprising at least one organic light emitting layer sandwiched between two electrode layers, characterized in that the ratio r of the sheet resistance of the bottom electrode layer and the top electrode layer is $0.3 \leq r \leq 3$.

\* \* \* \* \*